US009040427B2

(12) United States Patent
Ashraf et al.

(10) Patent No.: US 9,040,427 B2
(45) Date of Patent: May 26, 2015

(54) METHOD OF PLASMA ETCHING

(71) Applicant: SPTS TECHNOLOGIES LIMITED, Newport (GB)

(72) Inventors: Huma Ashraf, Newport (GB); Anthony Barker, Cardiff (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 14/043,818

(22) Filed: Oct. 1, 2013

(65) Prior Publication Data

US 2014/0097153 A1    Apr. 10, 2014

Related U.S. Application Data

(60) Provisional application No. 61/709,259, filed on Oct. 3, 2012.

(30) Foreign Application Priority Data

Oct. 3, 2012    (GB) .................................. 1217712.7

(51) Int. Cl.
| H01L 21/302 | (2006.01) |
| C23F 1/12 | (2006.01) |
| H01J 37/32 | (2006.01) |
| H01L 21/3065 | (2006.01) |
| H01L 21/308 | (2006.01) |

(52) U.S. Cl.
CPC ............. *C23F 1/12* (2013.01); *H01J 37/32449* (2013.01); *H01L 21/3065* (2013.01); *H01L 21/3081* (2013.01)

(58) Field of Classification Search
CPC ............ H01L 21/308; H01L 21/31138; H01L 21/3065; H01L 21/31116; H01L 21/31144; H01J 37/3244; H01J 37/32449
USPC ......... 438/706, 711, 712, 714, 717, 719, 725; 216/41, 58, 79, 81; 156/345.24, 156/345.26, 345.33, 345.34
See application file for complete search history.

(56) References Cited

U.S. PATENT DOCUMENTS

| 4,946,547 | A | * | 8/1990 | Palmour et al. ................. 117/97 |
| 6,930,048 | B1 | | 8/2005 | Li et al. |
| 7,432,207 | B2 | * | 10/2008 | Fuse et al. ..................... 438/706 |
| 8,487,375 | B2 | * | 7/2013 | Okamoto ....................... 257/335 |
| 2005/0191852 | A1 | * | 9/2005 | Takigawa et al. .............. 438/637 |

(Continued)

FOREIGN PATENT DOCUMENTS

| DE | 102009028256 A1 | 2/2011 |
| WO | WO0203454 A2 | 1/2002 |

OTHER PUBLICATIONS

SPTS Receives Order from Packaging Specialist, published 2011.

*Primary Examiner* — Lan Vinh
(74) *Attorney, Agent, or Firm* — Volentine & Whitt, PLLC

(57) ABSTRACT

A method of plasma etching a silicon carbide workpiece includes forming a mask on a surface of the silicon carbide workpiece, performing an initial plasma etch on the masked surface using a first set of process conditions, wherein the plasma is produced using an etchant gas mixture which includes i) oxygen and ii) at least one fluorine rich gas which is present in the etchant gas mixture at a volume ratio of less than 50%, and subsequently performing a bulk plasma etch process using a second set of process conditions which differ from the first set of process conditions.

17 Claims, 5 Drawing Sheets

(56) References Cited

U.S. PATENT DOCUMENTS

2006/0009025 A1* 1/2006 Kanamura ............... 438/618
2008/0293240 A1* 11/2008 Kawada ............... 438/652
2009/0111275 A1* 4/2009 Hoshi et al. ............... 438/710

* cited by examiner

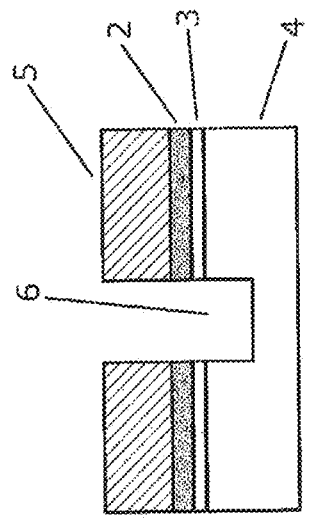
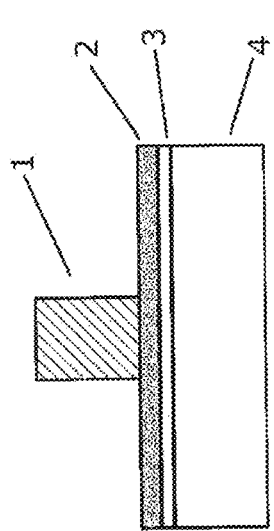
Fig. 2A
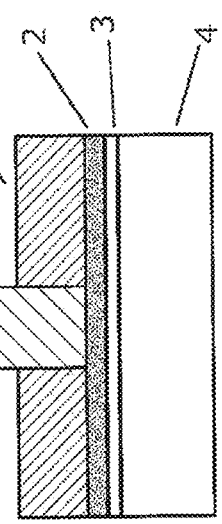
Fig. 2B
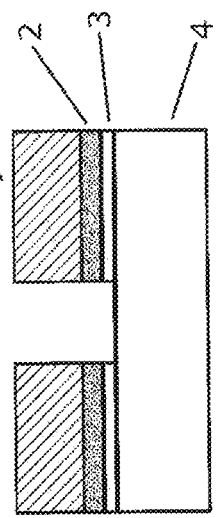
Fig. 2C
Fig. 2D

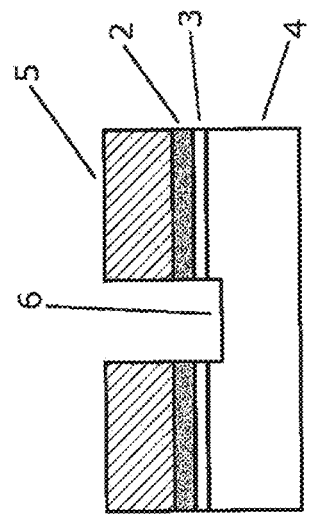
Fig. 3A
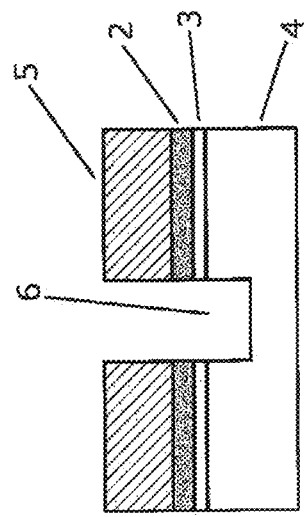
Fig. 3B
Fig. 3C
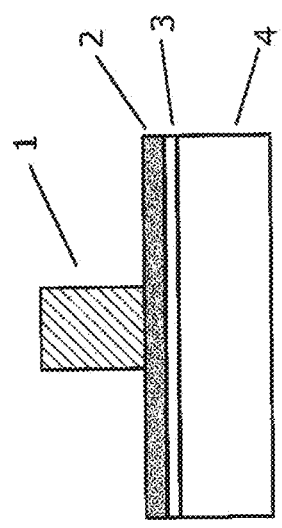
Fig. 3D
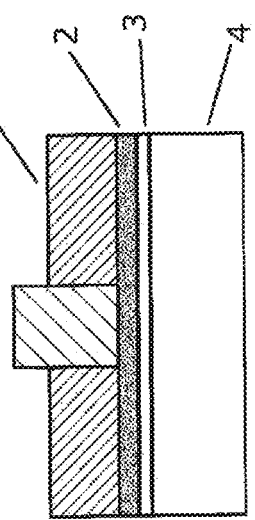
Fig. 3E
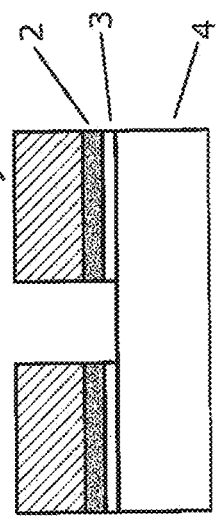

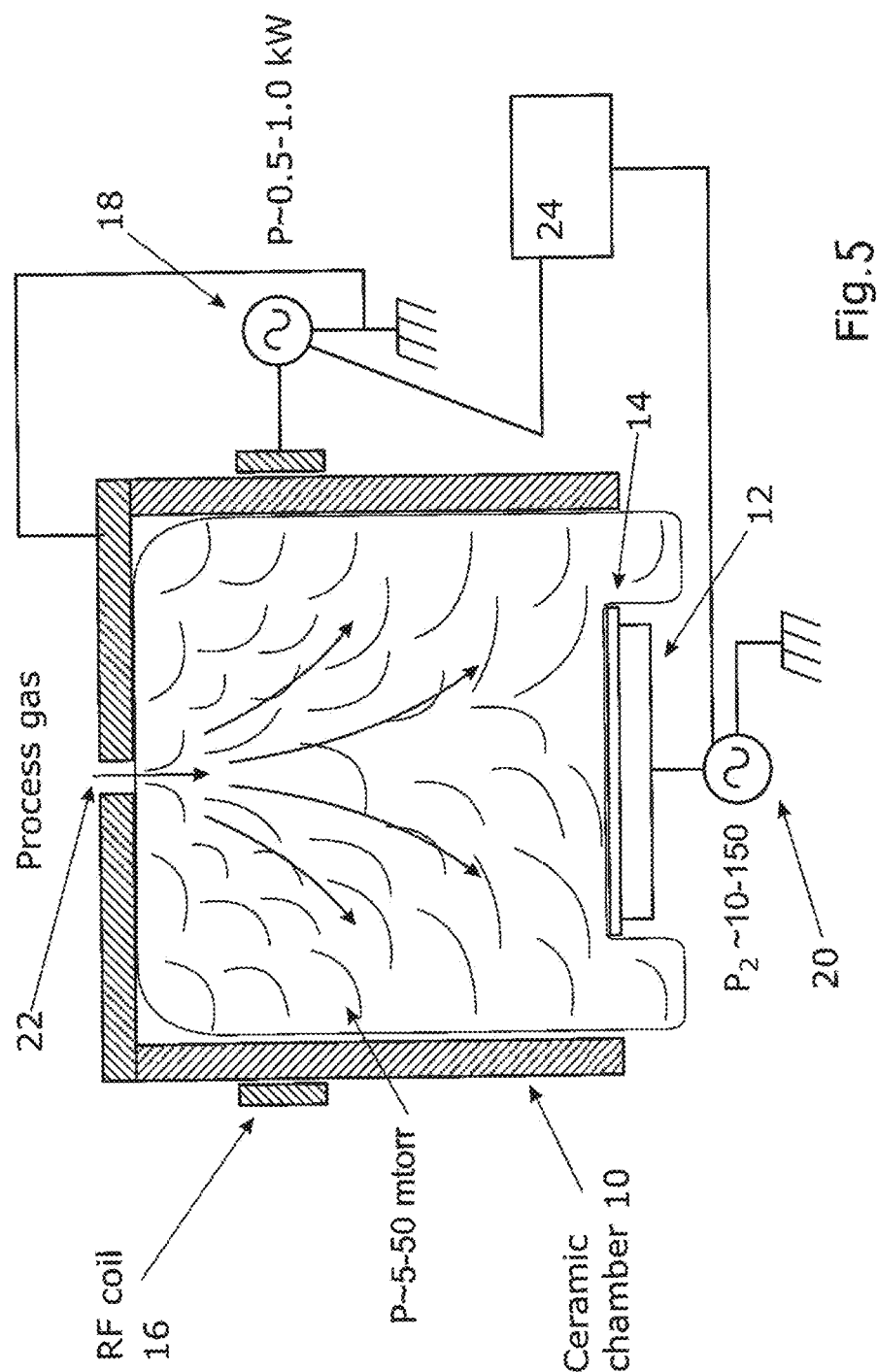

METHOD OF PLASMA ETCHING

BACKGROUND

This invention relates to a method of plasma etching a silicon carbide workpiece, and to related apparatus.

Silicon carbide is widely acknowledged as being an extremely difficult material to etch. It can be difficult to achieve etched features in silicon carbide which are substantially free of defects. Without being limited by any particular theory or conjecture, it is believed that this is due to surface imperfections formed in the substrate during previous process steps.

FIG. 1A is an optical micrograph showing 80 µm (dia.) vias 100 microns deep in SiC containing defects following SiC etching using SF6/He plasma in a prior art process, and FIG. 1B is an optical micrograph showing a top down image showing defect formation during plasma etching of SiC in a prior art process. These optical micrographs show typical defects resulting from plasma etching of silicon carbide using $SF_6$/$O_2$, $SF_6$/$O_2$/He, $SF_6$/$O_2$/Ar, or $SF_6$/$O_2$/Ar/He process gases. SiC layers are typically lapped down to ca. 100 micron thickness and bonded to carrier wafers prior to patterning and plasma etching. Significant defect formation is observed.

Nickel is frequently used as a hard mask for etching features such as vias into silicon carbide. A typical prior art process is shown in FIG. 2, in which (FIG. 2A) a thin barrier or adhesion layer of 50 nm Ti or TiW 3 is deposited on a SiC wafer 4, followed by deposition of a seed layer of ca. 0.5 micron gold 2. A photoresist 1 is then formed on the gold seed layer 2 using known photolithographic processes to define the position of the mask. A nickel mask 5 (typically ca. 5 microns thickness) is electroplated onto the gold seed layer 2 (FIG. 2B). After electroplating with nickel, the photoresist is stripped and the seed layers over the vias removed by wet chemistry as can be seen in FIG. 2C. More particularly, gold is removed with KI solution and TiW is removed with hydrogen peroxide. FIG. 2D shows the results of an anisotropic SiC via etch process, showing a single etched via 6.

As stated above, FIG. 2C depicts a processing stage after the photoresist has been stripped and the seed layers over the vias removed by wet chemistry. If processing then directly proceeds with a bulk etch step, then typically heavy defect formation is observed. It is common for greater than 50% of vias features to contain defects. It is known to perform a breakthrough step prior to commencement of the bulk etch step. A breakthrough step is a specific step of process conditions which are used to initiate the SiC etch step, prior to the bulk etch step. An argon plasma breakthrough step has been used for this purpose, and this is often enhanced by the addition of some oxygen to remove traces of photoresist or other organic material. In some instances this is sufficient to clear seed layer residues. However, depending on the level of residue that is present, a breakthrough step of this type may be insufficient to remove residues and damage prior to the main, bulk, SiC etch step, resulting in the presence of defects in the etched product. An example of a workpiece where the simple breakthrough step using an argon plasma is insufficient to avoid defect formation is lapped (but unpolished) silicon carbide. It has been suggested that the defects are caused by residues of seed layers present and dislocations created by the SiC lapping step (Ju-Ai Ruan et al, SiC Substrate Via Etch Process Optimisation, CS MANTECH Conference, May 18-21, 2009, Tampa, Fla., USA). Also, it has been recommended to reduce defect formation by controlling various process parameters during the bulk etch step, such as by reducing pressure (Ruan et al, ibid; Semiconductor Today Compounds & Advanced Silicon, Vol. 4, 10, December 2009/January 2010, 54-55; N Okamoto et al, Backside Process Considerations for Fabricating Millimeter-Wave GaN HEMT MMICs, CS MANTECH Conference, May 17-20, 2010, Portland, Oreg., USA).

SUMMARY

The present invention, in at least some of its embodiments, provides an improved process for etching silicon carbide which reduces the density of defects significantly. This can also provide a substantial reduction in the process time. Associated apparatus for performing the method of the invention are also provided.

According to a first aspect of the invention there is provided a method of plasma etching a silicon carbide workpiece including the steps of:

forming a mask on the surface of the silicon carbide workpiece;

performing an initial plasma etch of the masked surface using a first set of process conditions, wherein the plasma is produced using an etchant gas mixture which includes (i) oxygen and (ii) at least one fluorine rich gas which is present in the etchant gas mixture at a volume ratio of less than 50%; and subsequently performing a bulk plasma etch process using a second set of process conditions which differ from the first set of process conditions.

The term "fluorine rich gas" is understood to encompass within its scope molecules in which the number of fluorine atoms in the molecular formula exceeds the total number of atoms other than fluorine in the molecular formula.

The fluorine rich gas may be present in the etchant gas mixture at a volume ratio in the range 0.1-20%, preferably in the range 0.1-10%, more preferably in the range 0.5-7%, more preferably still in the range 1.0-5.0%. Most preferably, the fluorine rich gas is present in the etchant gas mixture at a volume ratio of about 1.5%.

The fluorine rich gas or gases may be present in the etching gas mixture with oxygen only. Alternatively, the etchant gas mixture may contain one or more diluent gases. In some embodiments the etchant gas mixture further includes an inert gas carrier. The inert gas carrier may be a noble gas, preferably argon. Helium may also be used.

Preferred examples of fluorine rich gases are $CF_4$ and $SF_6$. $CF_3H$ may be used.

It is preferred to use a single fluorine rich gas, and it is most preferred to use $CF_4$ as a single fluorine rich gas. Mixtures of fluorine rich gases, e.g. $CF_4$ and $SF_6$, may be used. Where a mixture of fluorine rich gases is used, the volume ratios of the fluorine rich gas described herein are understood to refer to the volume ratio with respect to all of the fluorine rich gases present in the etchant gas mixture.

The mask may be formed from any material used in photolithographic processes and which is compatible with silicon carbide. The mask may be a metallic mask, and often a nickel mask is used.

The surface of the silicon carbide workpiece on which the mask is formed may be unpolished. The surface of the silicon carbide workpiece on which the mask is formed may be lapped. Without wishing to be bound by any particular theory or conjecture, it is believed that the lapped surface of the silicon carbide workpiece has defects which, if not removed or at least reduced in density prior to the main etch, will result in columnar growths in the etched feature. It is possible that these defects also interact with the barrier and seed layers used in the masking process. This mechanism may apply to other silicon carbide surfaces.

The initial plasma etch may be performed to an etch depth of at least 250 nm. In some embodiments, the initial plasma etch is performed to an etch depth of at least 700 nm. In general, the attainment of greater etch depths during initial plasma etch provides enhanced reductions in the known defects.

The plasma etching of the silicon carbide workpiece may be performed to provide one or more vias. The production of other etched features is also within the scope of the invention.

In some embodiments, an inductively coupled plasma (ICP) is used to perform the etching. Other forms of plasma etching may be employed.

Other process conditions of the initial plasma etch can be varied in order to optimise the process. For example, it has been found that increasing the process pressure during the initial plasma etch step can provide reductions in defect levels. In one system, an increase in pressure from 5 to 10 mT resulted in improvements. For etching processes which utilise a substrate bias it has been found that increasing the bias power can result in reductions in the defect level.

According to a second aspect of the invention there is provided an apparatus for etching a silicon carbide workpiece including: a chamber; a workpiece support positioned in the chamber; a gas supply and pumping arrangement for providing etchant gases to the chamber; and a control arrangement configured to control the apparatus, including the gas supply and pumping arrangement, to perform a method according to the first aspect of the invention.

Whilst the invention has been described above it extends to any inventive combination of the features set out above, or in the following description, drawings or claims. For example, any features in relation to the first aspect of the invention may be incorporated in the second aspect of the invention and visa versa.

BRIEF DESCRIPTION OF THE DRAWINGS

The invention may be performed in various ways and specific embodiments will now be described, by way of example only, with reference to the accompanying drawings, in which:

FIGS. 2A, 2B, 2C and 2D respectively show the formation of a photoresist on a silicon carbide surface, the formation of a mask, the removal of the photoresist and seed layers, and the formation of an etched feature in a prior art process for etching silicon carbide;

FIGS. 3A, 3B, 3C, 3D and 3E respectively show the formation of a photoresist on a silicon carbide surface, the formation of a mask, the removal of the photoresist and seed layers, a breakthrough step, and a bulk etch step to produce an etched feature in a process for etching silicon carbide in accordance with the invention;

FIG. 5 is a semi-schematic diagram of apparatus used in accordance with the invention.

DETAILED DESCRIPTION

Figure 1A:
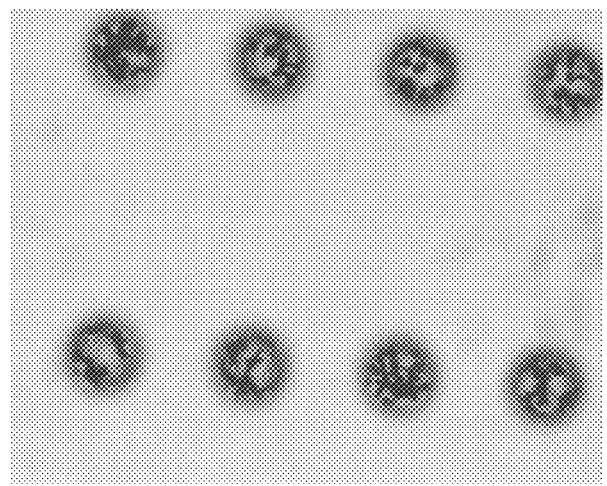
FIG. 1A shows an optical micrograph of eight vias of 80 micron diameter, 100 micron depth containing defects following SiC etching using a $SF_6$/He plasma.
Figure 1B:
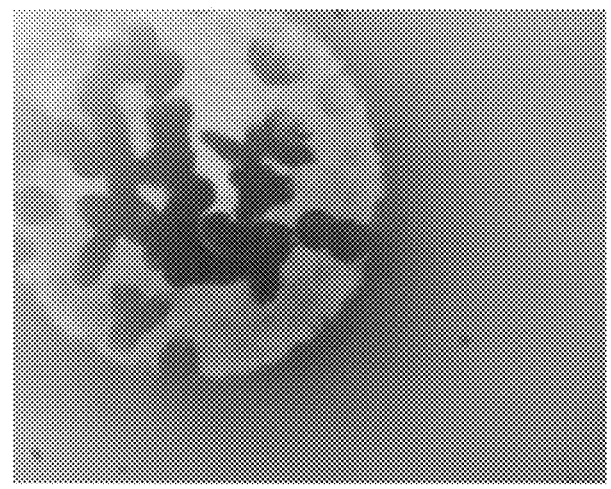
FIG. 1B shows a top down optical micrograph showing defect formation during plasma etching of SiC.

FIG. 3 is a representation of a process of the invention. FIG. 3 shares a number of the steps and features shown in FIG. 2 and identical numerals are used to denote such shared features. In particular, FIGS. 3A-C are essentially identical to FIGS. 2A-C. FIG. 3D shows an additional, breakthrough step provided by the invention. The breakthrough step is an initial plasma etch step which breaks through the surface and begins the etch by forming an initial etch feature 7. Subsequently, a bulk plasma etch process is performed which etches much more deeply into the silicon carbide workpiece.

A typical prior art breakthrough step with Ar and $O_2$ only removes a few tens of nm of SiC in 15 minutes. For highly polished surfaces this can be sufficient to achieve satisfactory etching which is free of defects. However, in other instances, such as for lapped surfaces, this results in greater than 50% of etched features such as vias having defects. It has been found that the additional of a relatively small amount of $CF_4$ (at a volume ratio of about 1.4-1.8%) increases the SiC etch rate so that the $CF_4$/Ar/$O_2$ etching gas mixture results in the removal of 300 nm SiC in 15 minutes. Reduced levels of defects are observed. $SF_6$ has been used in place of $CF_4$, i.e., etching gas mixtures comprising $SF_6$/Ar/$O_2$ have been used. It has been found that similar, relatively low, mixing ratios result in a similar improvement in the level of defects being observed with $SF_6$. The use of higher mixing ratios of $CF_4$ or $SF_6$ eventually results in an increase in the level of defects on lapped SiC. It is believed this is because of preferential etching where lapping damage is greatest, causing pitting of the surface.

Etching was performed using a commercially available inductively coupled plasma (ICP) apparatus such as an Omega (RTM) ICP tool produced by SPTS Technologies Limited (Newport, NP18 2TA, UK) which applies an RF bias to the wafer. FIG. 5 is a semi-schematic diagram depicting apparatus used for the experiments. The apparatus comprises a chamber 10 which houses a platen 12. The workpiece wafer 14 is disposed on the platen 12. An RF coil 16 is located around the periphery of the chamber 10, and RF power is supplied to the RF coil by an RF power supply 18 at an RF frequency of 13.56 MHz. A separate RF bias is applied to the platen 12 by a further RF power supply 20. The process gases are introduced into the chamber 10 through an inlet 22. The gas supply lines, valves, mass flow controllers and pumping arrangements which are associated with the supply of process gases to chamber 10 and their removal therefrom are not shown in FIG. 5 for presentational simplicity. However, the skilled reader will appreciate that the design of the apparatus and its operation in order to perform the bulk etch is well understood in the art. The apparatus further comprises a controller 24 which controls the operation of the RF power supplies 18, 20 and the operation of the gas supply system and pumping arrangements (not shown) to control the supply of the process gases into the chamber 10. The skilled reader will appreciate that the general principles of using a controller 24 to control these process parameters is well understood, and the types of devices which may be used as controllers 24 is also well understood. The present invention can be implemented by adapting such known controllers to also control the initial plasma etch step provided by the present invention. The controller 24 is also configured to stop the initial plasma etch at an appropriate time, and to commence the bulk plasma etch. In these experiments, the initial, breakthrough plasma etch and the bulk etch are performed in the same chamber. The bulk etch was a conventional $SF_6$/$O_2$ etch. Ar or He might be added as well. It is within the scope of the invention to perform the two etched steps in different chambers, but it is believed that it is operationally more attractive to use a single chamber. It was found that the process could be optimised through variation of various process parameters. In particular, it was found that increasing the process pressure and the RF bias increases the etch depth achieved during the initial plasma etch from 300 nm to greater than 800 nm in 15 minutes. This further reduces the level of defects to a highly satisfactorily level. Process parameters and results are shown in Table 1.

TABLE 1

Breakthough step summary: Source power for above processes is fixed at 1000 W RF (13.56 Mhz) with platen temperature ~10-20° C.

|  | Process A | Process B | Process C |
| --- | --- | --- | --- |
| CF4 (sccm) | 0 | 3 | 3 |
| Ar (sccm) | 130 | 130 | 130 |
| O2 (sccm) | 50 | 50 | 50 |
| Pressure (mT) | 5 | 5 | 10 |
| RF bias (W) | 150 | 150 | 300 |
| SiC removal in 15 min (nm) | 20-40 | 300 | 800 |
| Defectivity (%) | 50-100 |  | 0-1.5 |

Figure 4A:
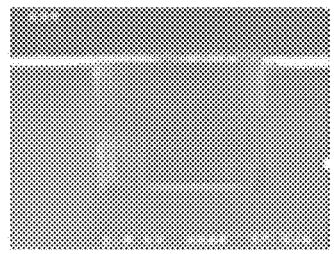
FIGS. 4A, 4B, 4C and 4D shows SEM cross sections and optical micrographs of silicon carbide vias produced in accordance with the invention.
Figure 4B:
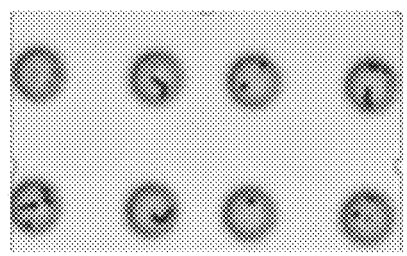
Figure 4C:
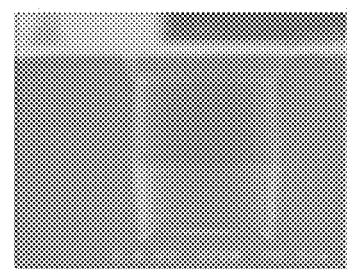
Figure 4D:
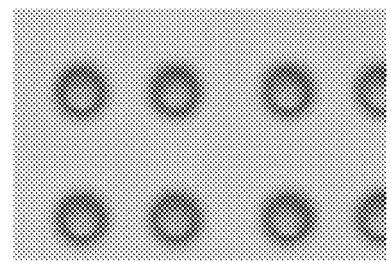

FIG. 4A shows a SEM cross section of a SiC via etched according to process A and FIG. 4B shows an optical micrograph of SiC vias etched according to process A. FIG. 4C also shows a SEM cross section of a SiC via etched in accordance to process C and FIG. 4D shows an optical micrograph of SiC vias etched in accordance with process C. The benefit of removing around 800 nm or more of the lapped SiC surface is evident from the elimination of defects in the vias.

It has been demonstrated that the defect levels attained can be varied by varying process conditions in the initial, breakthrough plasma etch and by varying the etch depth achieved during this etching step. The duration of the initial breakthrough plasma etch can be optimised together with other process parameters depending on the quality of the SiC wafers to be etched.

What is claimed is:

1. A method of plasma etching a silicon carbide wafer, including the steps of:
    forming a mask on a surface of the silicon carbide wafer;
    performing an initial plasma etch comprising etching the masked surface using plasma under a first set of process conditions, wherein the plasma is produced using an etchant gas mixture which includes i) oxygen and ii) at least one fluorine rich gas which is present in the etchant gas mixture at a volume ratio of less than 50%; and
    subsequently performing a bulk plasma etch process comprising etching the silicon carbide wafer using plasma under a second set of process conditions which differ from the first set of process conditions.

2. A method according to claim 1 in which the fluorine rich gas is present in the etchant gas mixture at a volume ratio in the range 0.1-20%.

3. A method according to claim 1 in which the at least one fluorine rich gas is $CF_4$ and/or $SF_6$.

4. A method according to claim 1 in which the plasma etching of the silicon carbide wafer is performed to provide one or more vias.

5. An apparatus for etching a silicon carbide workpiece including: a chamber; a workpiece support positioned in the chamber; a gas supply and pumping arrangement for providing etchant gases to the chamber; and a control arrangement configured to control the apparatus, including the gas supply and pumping arrangement, to perform a method according to claim 1.

6. A method according to claim 1 in which the fluorine rich gas is present in the etchant gas mixture at a volume ratio in the range 0.1-10%.

7. A method according to claim 1 in which the fluorine rich gas is present in the etchant gas mixture at a volume ratio in the range of 0.5-7%.

8. A method according to claim 1 in which the fluorine rich gas is present in the etchant gas mixture at a volume ratio of about 1.5%.

9. A method according to claim 1 in which the mask is a metallic mask.

10. A method according to claim 9 in which the mask is a nickel mask.

11. A method according to claim 1 in which the surface of the silicon carbide wafer on which the mask is formed is unpolished.

12. A method according to claim 11 in which the surface of the silicon carbide wafer on which the mask is formed is lapped.

13. A method according to claim 1 in which the initial plasma etch is performed to an etch depth of at least 250 nm.

14. A method according to claim 13 in which the initial plasma etch is performed to an etch depth of at least 700 nm.

15. A method according to claim 1 in which the etchant gas mixture further includes an inert carrier gas.

16. A method according to claim 15 in which the inert carrier gas is a noble gas.

17. A method according to claim 15 in which the inert carrier gas is argon.

* * * * *